(12) United States Patent
Davison

(10) Patent No.: US 7,784,178 B2
(45) Date of Patent: Aug. 31, 2010

(54) HIGHER PERFORMANCE BARRIER MATERIALS FOR CONTAINERS OF ENVIRONMENTALLY SENSITIVE SEMICONDUCTOR FABRICATION DEVICES

(75) Inventor: Peter Davison, Puyallup, WA (US)

(73) Assignee: Intel Corporation, Santa Clara, CA (US)

( * ) Notice: Subject to any disclaimer, the term of this patent is extended or adjusted under 35 U.S.C. 154(b) by 458 days.

(21) Appl. No.: 11/771,654

(22) Filed: Jun. 29, 2007

(65) Prior Publication Data

US 2009/0001032 A1 Jan. 1, 2009

(51) Int. Cl.
*H01K 3/22* (2006.01)
(52) U.S. Cl. .............................. 29/848; 29/856; 29/883; 206/710; 206/711; 257/629; 257/678; 257/687
(58) Field of Classification Search .................... 29/848, 29/856, 858, 883; 206/454, 710, 711; 257/629, 257/660, 678, 687
See application file for complete search history.

(56) References Cited

U.S. PATENT DOCUMENTS

| | | | |
|---|---|---|---|
| 6,273,261 B1 * | 8/2001 | Hosoi | 206/711 |
| 6,808,352 B2 * | 10/2004 | Seita | 414/217.1 |
| 7,364,778 B2 * | 4/2008 | Miyakawa et al. | 428/35.7 |
| 7,400,383 B2 * | 7/2008 | Halbmaier et al. | 355/72 |

* cited by examiner

*Primary Examiner*—Thiem Phan
(74) *Attorney, Agent, or Firm*—Cool Patent, P.C.; Joseph P. Curtin

(57) ABSTRACT

Techniques associated with higher performance barrier materials for containers to contain one or more environmentally sensitive devices associated with semiconductor manufacture are generally described. In one example, an apparatus includes an enclosure to contain one or more environmentally sensitive devices associated with semiconductor manufacture, the enclosure comprising a liquid crystal polymer (LCP) to provide a barrier against at least water and oxygen and to reduce purging requirements, and a door coupled with the enclosure.

10 Claims, 2 Drawing Sheets

HIGHER PERFORMANCE BARRIER MATERIALS FOR CONTAINERS OF ENVIRONMENTALLY SENSITIVE SEMICONDUCTOR FABRICATION DEVICES

TECHNICAL FIELD

Embodiments disclosed herein are generally directed to the field of semiconductor manufacturing and, more particularly, to increasing barrier performance of containers to contain one or more environmentally sensitive devices associated with semiconductor manufacture.

BACKGROUND

Generally, wafer containers may be purged with a relatively inert gas such as nitrogen, clean dry air (CDA), or extra clean dry air (XCDA) to remove moisture, oxygen, and/or other reactive elements or compounds from a wafer environment. For example, a typical container may be purged to remove essentially all humidity, but may achieve a relative humidity of about 10% within the container after approximately 15 minutes making another purge necessary. Purging requirements may be approaching a near constant purge requirement in some applications. Current wafer enclosure materials may not provide a sufficient barrier against water and oxygen given current purging requirements. In one example, a typical current enclosure material for a wafer container includes polycarbonate, which may absorb and/or release moisture by nature.

BRIEF DESCRIPTION OF THE DRAWINGS

Embodiments disclosed herein are illustrated by way of example, and not by way of limitation, in the figures of the accompanying drawings in which like reference numerals refer to similar elements and in which.

Figure 1:
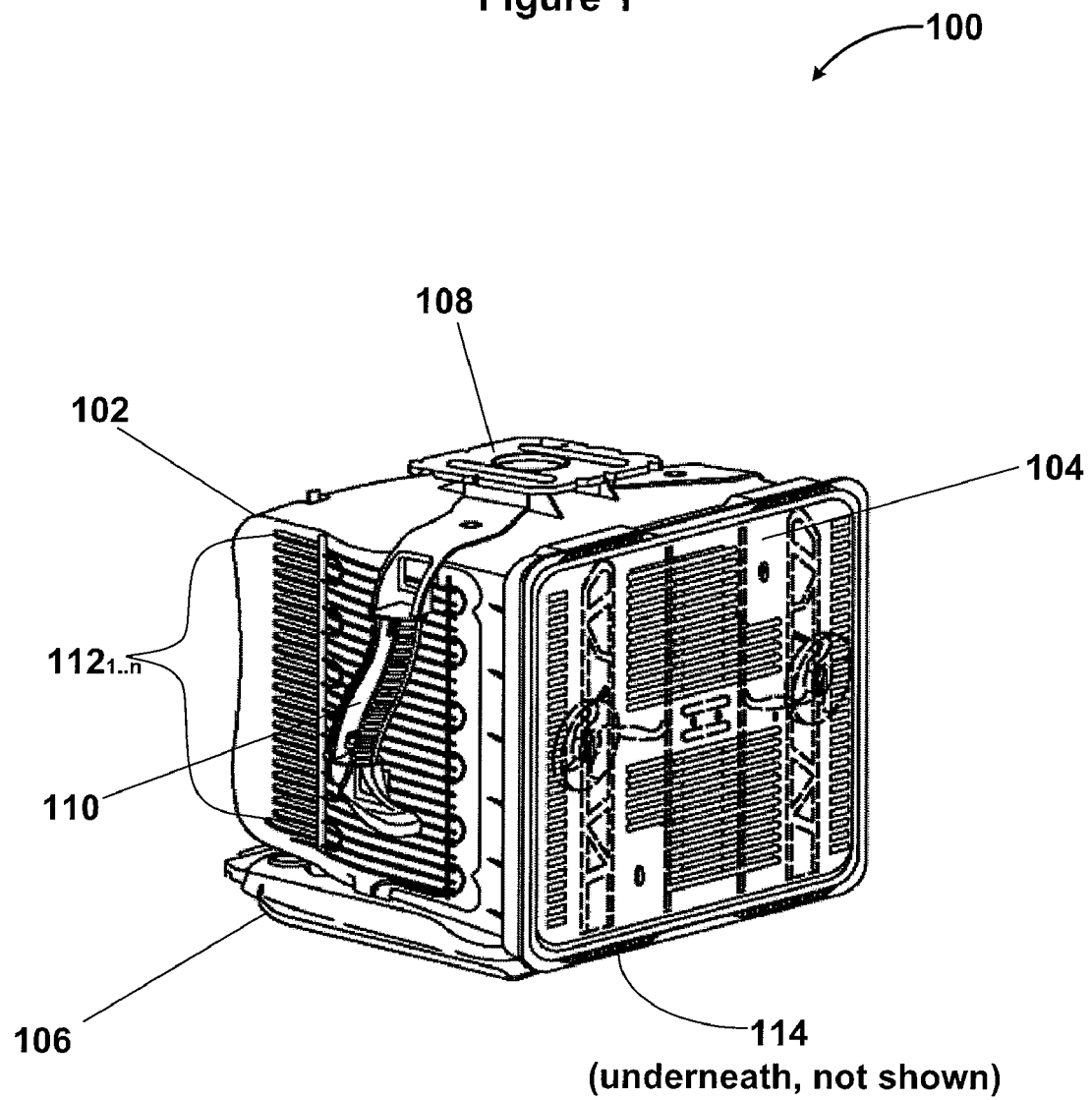
FIG. 1 is a depiction of a wafer container including liquid crystal polymer, according to but one embodiment.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

Embodiments of higher performance barrier materials for containers to contain one or more environmentally sensitive devices associated with semiconductor manufacture and associated techniques are described herein. In the following description, numerous specific details are set forth to provide a thorough understanding of embodiments disclosed herein. One skilled in the relevant art will recognize, however, that the embodiments disclosed herein can be practiced without one or more of the specific details, or with other methods, components, materials, and so forth. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

FIG. 1 is a depiction of a wafer container including liquid crystal polymer 100, according to but one embodiment. In an embodiment, a wafer container 100 includes an enclosure or shell 102, a door 104, a base 106, an automation flange 108, a handle 110, one or more wafer slot protrusions $112_{1...n}$ (in which n is an integer indicating the number of protrusions), and one or more purge ports 114 (underneath, not shown), each coupled as shown. Although a wafer container is depicted here 100, an apparatus 100 includes an enclosure or shell 102 to contain one or more environmentally sensitive devices associated with semiconductor manufacture. In an embodiment, enclosure 102 is for a reticle or mask container.

A wafer container 100 material may need to comport with a variety of barrier, structural, and/or electrostatic dissipation (ESD) requirements to provide a suitable environment for one or more wafers associated with semiconductor manufacture, according to one embodiment. Embodiments herein may disclose, among other things, higher performance barrier materials for wafer containers 100. Other embodiments may disclose higher performance barrier materials for a reticle container. In an embodiment, water vapor transmission rates (WVTR) and oxygen transmission rates (OTR) determine suitability of a material to provide a barrier against at least water and oxygen. In an embodiment, a suitable barrier material for a wafer container 100 may provide low absorption, low transmission, and low desorption of moisture and oxygen.

Polycarbonate may be a material that is currently used in wafer enclosures. In an embodiment, some example materials that provide higher barrier performance WVTR (meaning lower transmission rates) than polycarbonate include liquid crystal polymer (LCP), poly-chlorotrifluoroethylene (PCTFE) fluoropolymer, poly-vinylidenechloride (PVDC), high density polyethylene (HDPE), polytetrafluoroethylene (PTFE), fluorinated ethylene (FEP), ethylene-chlorotrifluoroethylene (ECTFE), polypropylene (PP), low density polyethylene (LDPE), and ethylene tetrafluoroethylene (ETFE). These materials may be listed in order of decreasing WVTR performance for a barrier material.

In an embodiment, a wafer container 100 includes an enclosure 102 to contain one or more wafers, the enclosure 102 including a liquid crystal polymer (LCP). An LCP may be a higher performance barrier material for a wafer enclosure 102 to provide a barrier against at least water and oxygen. A wafer enclosure 102 may provide a barrier against other high transmission particles (small particle size). In an embodiment, LCP provides a WVTR and OTR barrier performance on the order of about 150 to 200 times better than polycarbonate. The LCP family of resins may demonstrate superior barrier performance than polycarbonate in all WVTR and OTR areas including low absorption, low transmission, and low dissipation of moisture and/or oxygen. In an embodiment, a wafer container 100 having an enclosure 102 that includes LCP enables longer periods of time between purging. For example, a polycarbonate enclosure may require purging to maintain a relative humidity less than 10% once every 15 to 30 minutes. In contrast, an LCP enclosure 102 may require purging with a relatively inert gas such as nitrogen, clean dry air (CDA), or extra clean dry air (XCDA) about every 30-50 hours to maintain a relative humidity less than 10% inside of the enclosure 102. In an embodiment, LCP demonstrates outgassing of organics, metallic content, and anions that are comparable with polycarbonate.

Liquid crystal polymer (LCP) may also be known as liquid crystalline polymer or anisotropic melt polymer. In an embodiment, LCP is polyester based or polyamide based. In an embodiment, LCP comprises about 10 monomers and/or combinations of monomers, which may be combined in a variety of ways. In an embodiment, an enclosure 102 material includes LCP from the DuPont Zenite® families of LCP or from the Ticona Vectra® families of LCP. The DuPont Zenite® LCP families may include at least Zenite® 5000, Zenite® 6000, or Zenite® 7000, and other suitable families. The Ticona Vectra® family may include at least the Vectra® A950 variety, among others. In an embodiment, LCP includes suitable combinations of the above examples.

A suitable barrier material may also need to comport with other structural and/or electrostatic dissipation (ESD) requirements to provide a suitable container 100 for one or more wafers. In an embodiment, an enclosure 102 material includes a carbon fiber to provide a suitable dielectric property for a wafer environment. In an embodiment, a suitable wafer environment requires a wafer enclosure 102 material having between about $10^5$ and $10^{11}$ mhos of conductivity. In another embodiment, an enclosure 102 includes a carbon fiber to provide an enclosure 102 material with a conductivity of about $10^7$ mhos. In an embodiment, an enclosure 102 includes a milled carbon fiber. In another embodiment, an enclosure 102 includes LCP combined with a milled carbon fiber. In yet another embodiment, an enclosure 102 includes a low ionic grade and/or low metal grade graphite fiber, carbon fibrils, carbon nanotube material, carbon multi-wall nanotube (MWNT), or carbon powder in the LCP resin. In an embodiment, a wafer enclosure 102 material that includes LCP resin and carbon fiber or carbon powder is not transparent.

A wafer container 100 may include a door 104 that is removably coupled with the enclosure 102. A door 104 may be a Front-Opening Interface Mechanical Standard (FIMS) door in accordance with SEMI spec E62. In an embodiment, door 104 includes LCP to provide a barrier against at least water and oxygen. In another embodiment, door 104 includes a carbon material such as a fiber or powder. In other embodiments, a door 104 including LCP and another carbon material comports with embodiments for LCP and a carbon material already described with respect to enclosure 102. A wafer enclosure container 102 may be formed using an injection molding process or any other suitable method.

In an embodiment, a wafer container 100 is a Front Opening Unified Pod (FOUP). In another embodiment, a wafer container is a Front Opening Shipping Box (FOSB). In other embodiments, a door 104 is removably coupled to a bottom or side of a wafer enclosure 102. A wafer container may be a Bottom Opening Pod (BOP) or a Side Opening Pod (POD) in other embodiments. A wafer container 100 is not limited to these examples and may include any wafer container to contain one or more wafers. In an embodiment, a wafer container 100 is used to store, contain, hold, carry, transport, or ship one or more wafers.

In an embodiment, a wafer container 100 includes a base 106 coupled with enclosure 102, a handle 110 coupled with enclosure 102, an automation flange 108 coupled with enclosure 102, one or more purge ports 114 coupled with enclosure 102, and one or more wafer slot protrusions $112_{1 \ldots n}$ (n being an integer to indicate the number of wafer slot protrusions) coupled with enclosure 102 to hold one or more wafers. A base 106 may provide an engaging surface to correspond with one or more surfaces on equipment to receive a wafer container. In an embodiment, base 106 includes a k-flange for kinematic coupling with another surface. A handle 110 may be a manual lift handle to provide a means for picking up and/or carrying wafer container 100. An automation flange 108 may provide an alternative means for picking up and/or carrying a wafer container 100. In an embodiment, an automation flange 108 is provided to enable transport of container 100 using an overhead vehicle (OHV). One or more purge ports 114 (not shown) may enable purging of the inside of enclosure 102 with a relatively inert gas such as nitrogen, clean dry air (CDA), or extra clean dry air (XCDA).

One or more wafer slot protrusions $112_{1 \ldots n}$ may be coupled with enclosure 102 to provide wafer slots to hold one or more wafers. In an embodiment, one or more wafer slot protrusions $112_{1 \ldots n}$ include LCP and/or carbon fiber in accordance with embodiments already described for these materials. In another embodiment, one or more wafer slot protrusions $112_{1 \ldots n}$ are molded as part of enclosure 102. FIG. 1 may depict transparent walls for apparatus 100 merely for ease and clarity of description (i.e., to illustrate wafer slot protrusions $112_{1 \ldots n}$ within the enclosure). However, apparatus 100 may not have transparent walls. In an embodiment, an LCP enclosure 102 and LCP door 104 are opaque. In other embodiments, other barrier applications of an LCP material include containers for other environmentally sensitive instruments, components, devices, mechanisms and/or apparatuses that require a higher performance barrier material. In one embodiment, a reticle or lithography mask container includes LCP to provide a barrier against at least water, oxygen and/or other transmissive particles, elements, or molecules. In an embodiment, an apparatus includes an enclosure to contain one or more environmentally sensitive devices associated with semiconductor manufacture, the enclosure comprising a liquid crystal polymer (LCP) to provide a barrier against at least water and oxygen and to reduce purging requirements. An environmentally sensitive device at least includes those instruments, products, components, apparatuses, and/or elements that are sensitive to humidity, among other things. In an embodiment, a door is coupled with the enclosure. In other embodiments, LCP is self-extinguishing and provides a good barrier to smoke. Such properties may also increase LCP's suitability as a material for use in a semiconductor manufacturing application (i.e., to protect expensive property in the eventuality of a fire, for example).

Figure 2:
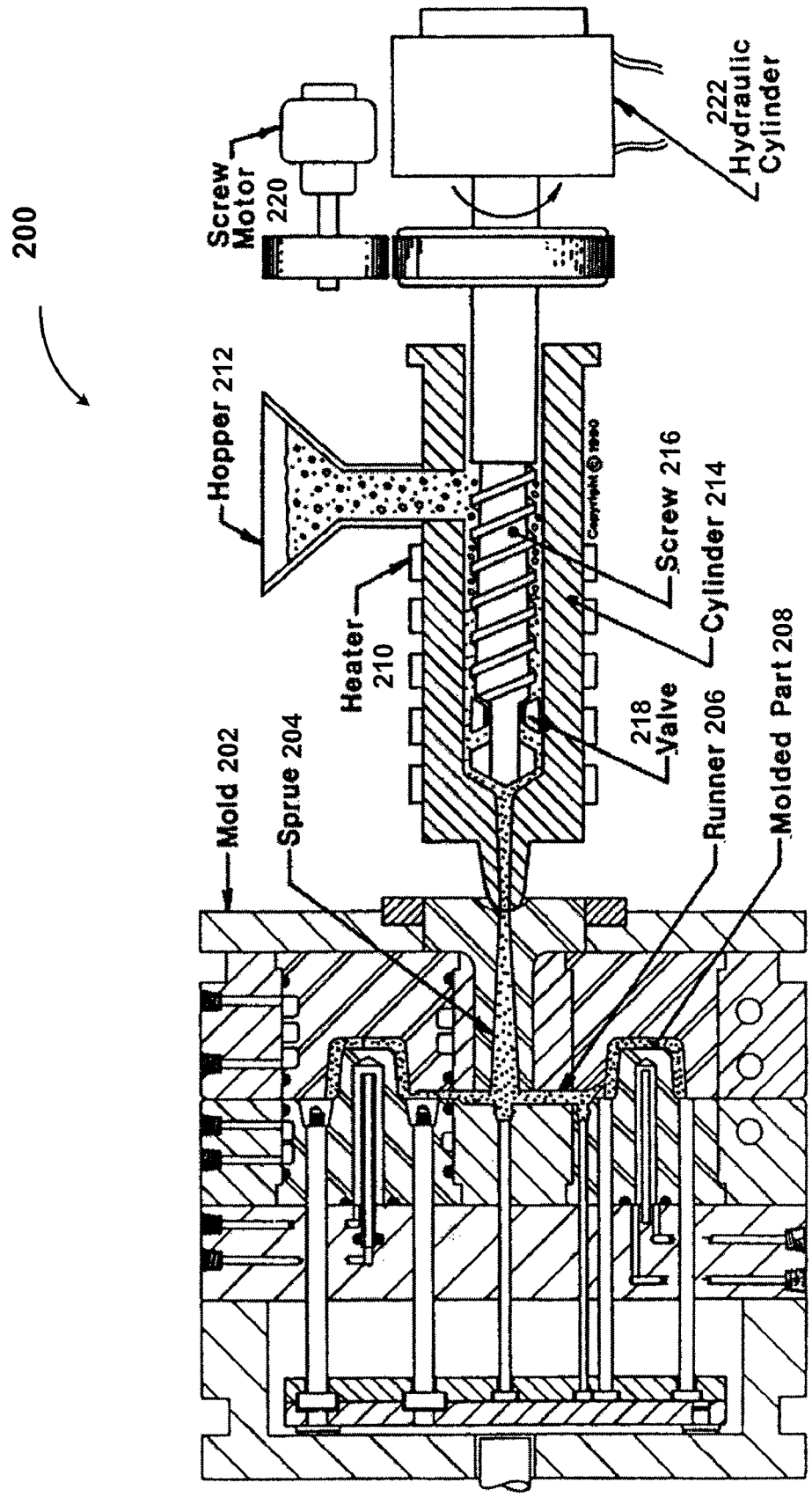
FIG. 2 is a schematic of an injection molding assembly for molding an enclosure to contain one or more environmentally sensitive devices associated with semiconductor manufacture, according to but one embodiment.

FIG. 2 is a schematic of an injection molding assembly for molding an enclosure to contain one or more environmentally sensitive devices associated with semiconductor manufacture. In an embodiment, a resulting enclosure provides a barrier against at least water and oxygen and reduces the amount of purging required of a relatively inert gas to maintain selected environmental conditions. In an embodiment, assembly 200 includes a mold 202, sprue 204, runner 206, molded part 208, heater 210, hopper 212, cylinder 214, screw 216, valve 218, screw motor 220, and hydraulic cylinder 222, each coupled as shown. In other embodiments, an electric machine or other suitable apparatus may be used instead of a hydraulic mechanism 222. In an embodiment, mold 202 includes a mold for a wafer enclosure in accordance with embodiments described and/or depicted already with respect to FIG. 1.

In an embodiment, a method includes injecting a resin comprising liquid crystal polymer (LCP) into a mold 202 for an enclosure to contain one or more environmentally sensitive devices associated with semiconductor manufacture, a resulting enclosure 208 to provide a barrier against at least water and oxygen and to reduce purging requirements. Assembly 200 may provide a basis for describing a method for molding a wafer enclosure 208. In another embodiment, a method includes injecting an LCP resin into a wafer enclosure mold 202, cooling the injected resin 208, opening the mold 202, and ejecting the wafer enclosure 208. Injecting may be accomplished via a screw 216 and check valve 218 powered by a hydraulic cylinder or electric motor 222 that turns and propels molten resin into a mold 202 through a sprue 204 and runner 206. Sprue 204 may refer to a passage through which a molten material (i.e., LCP with carbon fiber) is introduced into a mold 202 that is about parallel with the direction of draw and a runner 206 may refer to a passage through which a molten material is introduced into a mold 202 that is about perpendicular with the direction of draw. An LCP resin may also include carbon fiber or powder and may be melted by heater 210 upon being fed from hopper 212 into cylinder 214, which houses a screw 216 and valve 218 assembly.

In an embodiment, a method includes injecting an LCP resin into a mold 202 for a door 208 to be used in a wafer container. In another embodiment, injecting an LCP resin into a wafer enclosure mold 202 includes a wafer enclosure mold having one or more wafer slot protrusions to hold one or more wafers within the resulting wafer enclosure 208. In another embodiment, a wafer enclosure mold is adapted to create one or more wafer slot protrusions to hold one or more wafers within a resulting wafer enclosure 208.

In an embodiment, a method for fabricating a wafer container includes coupling a door with the wafer enclosure 208 such that the door is removably coupled with the enclosure 208, coupling a base with the wafer enclosure 208, coupling a handle with the wafer enclosure 208, coupling an automation flange with the wafer enclosure 208, and coupling one or more purge ports with the wafer enclosure 208.

In other embodiments, an injection molding method may be used to mold an enclosure for a reticle or mask. In an embodiment, a method includes injecting a resin comprising liquid crystal polymer (LCP) into a mold 202 for an enclosure to contain one or more environmentally sensitive devices associated with semiconductor manufacture, a resulting enclosure 208 to provide a barrier against at least water and oxygen and to reduce purging requirements and/or minimize defects on wafers, reticles, etc.

Various operations may be described as multiple discrete operations in turn, in a manner that is most helpful in understanding the embodiments disclosed herein. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments, including what is described in the Abstract, is not intended to be exhaustive or to limit to the precise forms disclosed. While specific embodiments and examples are described herein for illustrative purposes, various equivalent modifications are possible within the scope of this description, as those skilled in the relevant art will recognize.

These modifications can be made in light of the above detailed description. The terms used in the following claims should not be construed to limit the scope to the specific embodiments disclosed in the specification and the claims. Rather, the scope of the embodiments disclosed herein is to be determined entirely by the following claims, which are to be construed in accordance with established doctrines of claim interpretation.

What is claimed is:

1. An apparatus, comprising:
    an enclosure to contain one or more environmentally sensitive devices associated with semiconductor manufacture, the enclosure comprising a liquid crystal polymer (LCP) to provide a barrier against at least water and oxygen and providing purging requirements of purging of between about 30 to 50 hours to maintain a relative humidity in the enclosure of less than about 10%, the liquid crystal polymer (LCP) comprising a carbon nanotube material, a carbon multi-wall nanotube (MWNT), or carbon powder in the LCP; and
    a door coupled with the enclosure.

2. The apparatus according to claim 1, wherein the door comprises LCP to provide a barrier against at least water and oxygen.

3. The apparatus according to claim 2, wherein the enclosure comprises a wafer enclosure, the apparatus further comprising:
    a base coupled with the enclosure;
    a handle coupled with the enclosure;
    an automation flange coupled with the enclosure;
    one or more purge ports coupled with the enclosure; and
    one or more wafer slot protrusions coupled within the enclosure to hold one or more wafers.

4. The apparatus according to claim 3, wherein the one or more wafer slot protrusions comprise LCP.

5. The apparatus according to claim 4, wherein the enclosure is formed using an injection molding process.

6. The apparatus according to claim 5, wherein the enclosure comprises LCP DuPont Zenite® or LCP Ticona Vectra®, or suitable combinations thereof.

7. The apparatus according to claim 6, wherein the enclosure further comprises a low ionic grade, or low metal grade graphite fiber, or a combination thereof in the LCP.

8. The apparatus according to claim 7, wherein the enclosure further comprises a conductivity of between about $10^5$ and $10^{11}$ mhos.

9. The apparatus according to claim 8, wherein the enclosure comprises a reticle enclosure.

10. The apparatus according to claim 9, wherein the enclosure further comprises a conductivity of about $10^7$ mhos.

* * * * *